US006605951B1

(12) United States Patent
Cowan (10) Patent No.: US 6,605,951 B1
(45) Date of Patent: Aug. 12, 2003

(54) INTERCONNECTOR AND METHOD OF CONNECTING PROBES TO A DIE FOR FUNCTIONAL ANALYSIS

(75) Inventor: Joseph W. Cowan, West Linn, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/735,085

(22) Filed: Dec. 11, 2000

(51) Int. Cl.$^7$ .................. G01R 31/02; G01R 31/26; H01H 31/02
(52) U.S. Cl. .................. 324/754; 324/537; 324/765
(58) Field of Search .................. 324/754, 755, 324/757, 761, 537, 760, 765

(56) References Cited

U.S. PATENT DOCUMENTS

| | | | | |
|---|---|---|---|---|
| 4,811,081 A | * | 3/1989 | Lyden .................. | 257/668 |
| 5,475,316 A | * | 12/1995 | Hurley et al. .................. | 324/750 |
| 5,506,514 A | * | 4/1996 | Difrancesco .................. | 324/757 |
| 5,508,228 A | * | 4/1996 | Nolan et al. .................. | 438/614 |
| 5,543,724 A | * | 8/1996 | Christopher .................. | 324/754 |
| 5,545,465 A | * | 8/1996 | Gaynes et al. .................. | 428/209 |
| 5,611,884 A | * | 3/1997 | Bearing et al. .................. | 428/209 |
| 5,781,022 A | * | 7/1998 | Wood et al. .................. | 324/757 |
| 5,892,539 A | * | 4/1999 | Colvin .................. | 324/760 |
| 6,025,730 A | * | 2/2000 | Akram et al. .................. | 324/757 |
| 6,043,670 A | * | 3/2000 | Degani et al. .................. | 324/765 |
| 6,091,252 A | * | 7/2000 | Akram et al. .................. | 324/755 |
| 6,130,546 A | * | 10/2000 | Azizi .................. | 324/754 |
| 6,245,586 B1 | * | 6/2001 | Colvin .................. | 438/15 |
| 6,288,559 B1 | * | 9/2001 | Bernier et al. .................. | 324/765 |
| 6,314,641 B1 | * | 11/2001 | Akram .................. | 324/755 |
| 6,337,577 B1 | * | 1/2002 | Doherty et al. .................. | 324/754 |

OTHER PUBLICATIONS

Said F. Al–sarawi, *Tape–Automated Bonding*, Centre for High Performance Integrated Technologies and Systems (CHIPTEC), Mar. 1997, pp. 1–2.
Said F. Al–sarawi, *Solder Bump Bonding*, Centre for High Performance Integrated Technologies and Systems (CHIPTEC), Mar. 1997, 1 page.
Gary Shade and Kendall Scott Wills, *Photoemission Microscopy*, 1997 ASM International, pp. 181–182.
B. Bossman, P. Baurschmidt, K. Hussey, and E. Black, *Failure Analysis Techniques with the Confocal Laser Scanning Microscope*, ISTFA '92: The 18$^{th}$ International Symposium for Testing & Failure Analysis, Oct. 1992, pp. 351–361.
Nevil M. Wu, Kevin Weaver, James H. Lin, *Failure Analysis from Back Side of Die*, ISTFA '96: 22$^{nd}$ International Symposium for Testing and Failure Analysis, Nov. 1996, 7 pages.
TW. Joseph, A.L. Berry, B. Bossmann, *Infrared Laser Microscopy of Structures on Heavily Doped Silicon*, ISTFA '92: The 18$^{th}$ International Symposium for Testing & Failure Analysis, Oct. 1992, pp. 1–7.

(List continued on next page.)

Primary Examiner—Kamand Cuneo
Assistant Examiner—Jermele Hollington
(74) Attorney, Agent, or Firm—John R. Ley, LLC (57) ABSTRACT

Interconnectors are placed on a die containing a semiconductor device or integrated circuit which is to be tested or analyzed. The interconnector includes a bump contact for contacting a bond pad of the die, and a probe pad at a position spaced from the bump contact. An interconnector connects the bump contact and the probe pad. The interconnector is attached to the die with the bump contact in electrical contact with the bond pad and with the probe pad extending beyond an exterior peripheral edge of the die. Probes apply signals or power to the probe pad, and those signals and power are applied to the semiconductor device or integrated circuit to establish functionality for the test or analysis.

8 Claims, 5 Drawing Sheets

OTHER PUBLICATIONS

D.L. Barton, P. Tangyunyong, J.M. Soden, A.Y. Liang, F.J. Low, A.N. Zaplatin, K. Shivanandan, and G. Donohoe, *Infrared Light Emission from Semiconductor Devices*, Proceedings of the 22$^{nd}$ International Symposium for Testing and Failure Analysis, Nov. 1996, pp. 9–17.

Chun–Cheng Tsao, Steven, Kasapi, and Kurt Hurley, *Backside waveform probing of CMOS devices using infrared laser at wavelength of 1064 nm*, 6 pages.

C. Chiang, N. Khurana, D.T. Hurley, and K. Teasdale, *Backside Emission Microscopy for Integrated Circuits on Heavily Doped Substrate*, Proceedings from the 24$^{th}$ International Symposium for Testing and Failure Analysis, Nov. 1998, pp. 447–453.

Kendall Scott Wills, Terril Lewis, Greg Billus, Hai Hoang, *Optical Beam Induced Current Applications for Failure Analysis of VLSI Devices*, 1997 ASM International, pp. 21–26.

Yeoh Eng Hong and Martin Tay Tiong We, *The application of novel Failure Analysis Techniques for Advanced Multi-–Layered CMOS devices*, 6 pages.

T. Koyama, Y. Mashiko, M. Sekine, H. Koyama and K. Horie, *New non–bias optical beam induced current (NB–O-BIC) techniques for evaluation of A1 interconnects*, 1995 IEEE, pp. 228–233.

* cited by examiner

INTERCONNECTOR AND METHOD OF CONNECTING PROBES TO A DIE FOR FUNCTIONAL ANALYSIS

FIELD OF THE INVENTION

This invention relates to testing semiconductor devices formed on a wafer. More particularly, the present invention relates to a new and improved method and apparatus for placing power and signal probes on a semiconductor die cut from the wafer and applying power and signals to the die while performing testing and failure analysis.

BACKGROUND OF THE INVENTION

Failure analysis of a semiconductor device is done with a variety of techniques used to locate, analyze, and identify faults in the device. The semiconductor integrated circuit (IC) or chip is typically formed on a silicon substrate using a layering technique which results in a multilayered device composed of various layers of metal, polysilicon, dielectric and other materials. Many ICs are fabricated at once on a wafer. Thereafter, using one type of testing and failure analysis technique, the wafer is cut into die with each die or chip containing an IC. Testing or failure analysis is then performed on the die. If the IC is meets the functional specifications, the die is placed into a package and leads are attached between bond pads of the IC and bond pads of the package.

Typical failure analysis techniques used on the front side of the die include mechanical probing, electron beam probing, photo emission microscopy, and optical beam induced current ("OBIC"). The die is placed on the platen of a testing station and power and signal probes are placed on the front surface of the die to power up the IC. The failure analysis techniques are then used on the front surface of the die to detect and isolate faults in the IC. Some optical failure analysis techniques, such as emission microscopy and OBIC, are also performed on the back side of the die.

Photo emission microscopy is a "hot spot" detection technique which detects photons emitted from faults in the IC. The type of faults which typically generate a photo emission include junction defects, contact spiking, hot electrons, latch-up, poly filaments, and substrate damage and contamination. The photo emissions are typically the result of electron-hole recombinations which generate light primarily in the infrared region of the light spectrum. The photo emissions are transmitted through semi-transparent dielectric layers, polysilicon layers, and passivity layers, and emerge from the front side of the die where they may be seen by viewing the front side of the die. The photo emissions are also transmitted through the substrate of the die and emerge from the back side of the die where they may be seen by viewing the back surface of the die.

In photo emission microscopy, an infrared optical microscopic device or other infrared optical viewing device, such as a charge coupled device (CCD) camera with a monitor, is used to obtain an image of the photo emissions from the back side of the die. The photo emission image is overlaid on a bright field reference image of the IC to isolate and identify the fault sites associated with the photo emissions. Power and signals must be supplied to the IC in the photo emission microscopy technique. The power and signals are supplied to the IC by placing power and signal probes on the die and supplying power and signals from external sources to the probes when performing the testing or failure analysis.

The effectiveness of optical failure analysis techniques used on the front side of the die is diminished because of the increased complexity of many ICs. In particular, ICs are being manufactured with additional metal interconnect layers. The increasing number of layers makes photo emission microscopy from the front side of the die difficult, if not impossible, because of the lack of visibility of the photo emissions from the front side of the die. The additional metal interconnect layers include as many as six upper layers for power busses, high density signal routing signal lines, and bond pads. The metal interconnect layers are place above the substrate of the wafer where active devices, such as transistors, are formed. Active transistors are generally the source of most faults detectable using optical failure analysis techniques on the front side of the die. The photons emitted from the fault cannot pass through the numerous opaque metal interconnect layers of the device. Instead, the photon emissions pass between or are scattered around the metal interconnect layers, preventing the detection of photo emissions from the surface of the die or otherwise decreasing the accuracy of locating the fault. The effectiveness of the optical failure analysis techniques used on the front side of the die is diminished because the additional metal interconnect layers obstruct the visibility of faults in the active devices. However, optical photo emission microscopy can be effectively used on the back side of the die where it is less likely that faults are obstructed by metal interconnect layers.

If the IC on the die is found to be functional, the die is placed into the package for further testing. Typically, wire bonding is then used to directly connect bond pads of the die to bond pads of the package. Alternatively, tape-automated bonding is used to connect the bond pads of the die to bond pads of a tape bond which form the bond pads of the package. The bond pads of the tape bond are connected to pins of the package with leads to complete an electrical connection between the bond pads of the die and the pins of the package. The packaged IC is then tested for functionality and electrical specifications.

In tape-automated bonding, interconnections to connect the IC to the bond pads of the tape bond are patterned on a polymer tape. The interconnections are typically metal tracks or conductors on the tape to contact bond pads on the periphery of the die. The tape bond is attached to the bare die by contacting the bond pads to the metal tracks or the metal bumps. An adhesive is used to secure the tape bond to the die.

Application of the testing and failure analysis techniques on the back side of the die is complicated with existing die probing techniques. Typically, the die is affixed to a transparent support beneath an emission microscope or an infrared sensitive CCD camera. Power and signal probes are then placed on the contact pads of the semiconductor device after the die is inverted. The process of contacting the probes to the semiconductor device typically involves viewing the surface of the inverted die on a video monitor while mechanically manipulating the probes to place probes tips on the contact pads of the IC on the die. This process is complicated in terms of eye-to-hand coordination since the video image is a reverse image of the die from the viewpoint of a normal viewing. Also, the equipment operator must view the die surface indirectly though the video monitor rather than viewing the die surface directly while placing the probes on the die. The process of connecting the probes to the semiconductor device is tedious, time-consuming and prone to error.

Application of the testing and failure analysis techniques on the front side of the die is also complicated with existing probing techniques. The probes are typically placed on the front side of the die by contacting tips of the probes to the very small contact pads on the front side of the die by using a microscope. The probes have a relatively long, cantilevered-like arm which extend from micrometer-like devices used to adjust the mechanical position of the tips of the probes. Because of the relatively long arm of the probes and their cantilevered extension from the adjustment mechanism, the movement of the tip of the probes is magnified, which makes it difficult, tedious and time-consuming to precisely and accurately position the probe tip on the desired contact pad of the IC. Moreover, the probe tip is also subject to natural environmental vibrations because of the magnification effect of the relatively long arm of the probe. Consequently, connecting the probes to the semiconductor device for front side failure analysis techniques is also difficult and prone to error.

It is with respect to these and other considerations that have given rise to the present invention.

SUMMARY OF THE INVENTION

One aspect of the present invention relates to facilitating the application of probes to an IC on a die for testing and failure analysis. Other aspects of the invention relate to avoiding the difficulties and reducing the time required to connect the power and signal probes to the IC, avoiding reverse images and indirect viewing of the die while manipulating the probes, and avoiding the necessity for direct mechanical placement of the probes on the die.

In accordance with these features, one aspect of the present invention relates to a method of a performing testing or failure analysis on a die having bond pads connected to an integrated circuit formed on the die. The method involves electrically contacting an interconnector to the bond pad, extending the interconnector to a position beyond an exterior peripheral edge of the die while maintaining the electrical contact of the interconnector to the bond pad, and connecting a testing or analysis probe to the interconnector at a location beyond the exterior peripheral edge of the die, and supplying an electrical signal or electrical power through the probe to the interconnector and the bond pad and the integrated circuit, and performing the testing or failure analysis while supplying the signal or power to the integrated circuit. Preferably, the interconnector is adhesively connected to the die.

Another aspect of the present invention relates to the interconnector which electrically connects the probe to the bond pad of the die which contains the integrated circuit. The interconnector includes a piece of electrically insulating material having a front surface, an electrically conductive bump contact mounted on the front surface of the insulating material, an electrically conductive probe pad mounted on the front surface of the insulating material at a position spaced from the bump contact to be positioned beyond the peripheral edge of the die for contact with the probe, and an adhesive for physically holding the bump contact in electrical contact with the bond pad.

The strip or pad may be formed as a multi-layered laminated structure with a top insulating layer from which the bump contact extends and a conductive layer which defines the electrical conductor extending between the bump contact and the probe pad. Additional alternating layers of insulation and conductive material may be included in the laminated structure. A plurality of bump contacts may be located at a generally interior position of the pad, and a plurality of probe pads may be located at a generally exterior position of the pad adjacent to edges of the pad, thereby establishing multiple electrical contacts to multiple bond pads of the die from multiple probes.

Other preferable aspects of the method include connecting the interconnector to the die while a front side of the die is facing upward and inverting the die and the connected interconnector to face the front side of the die downward when performing the testing or failure analysis, preferably through a microscope.

A more complete appreciation of the present invention and its improvements can be obtained by reference to the accompanying drawings, which are briefly summarized below, by reference to the following detailed description of a presently preferred embodiment of the invention, and by reference to the appended claims.

DETAILED DESCRIPTION

Figure 1:
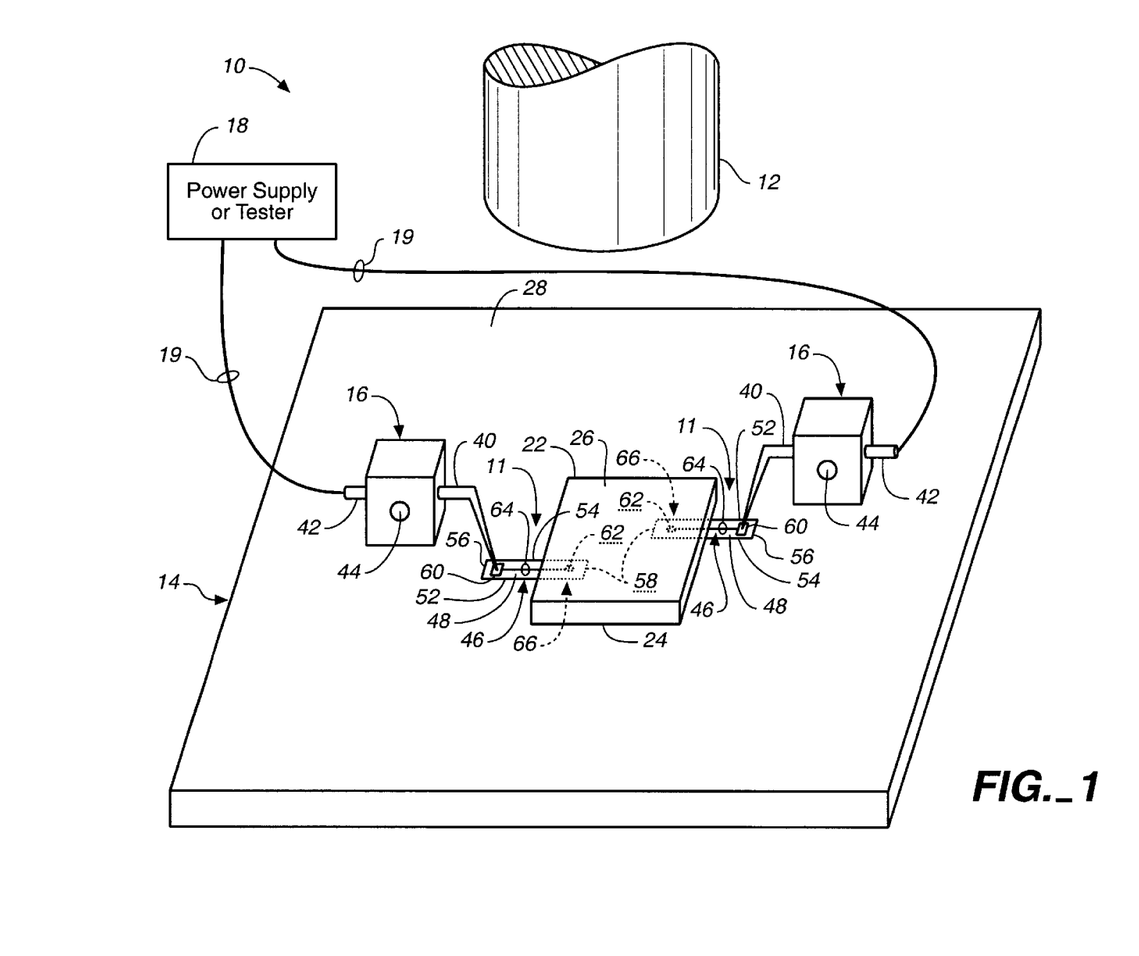
FIG. 1 is a generalized perspective view of an optical system for conducting testing or failure analysis on a die using an interconnector incorporating the present invention, showing the die and the interconnector in a greatly exaggerated scale relative to the other components.

A system 10 for performing photo emission microscopy on a semiconductor integrated circuit (IC) chip or die 22 by using interconnector 11 is shown in FIG. 1. The system 10 includes a conventional microscope 12, a conventional platen 14, conventional power and signal probes 16, a conventional power supply or tester 18 and conventional connection wires 19. The interconnectors 11 are connected between conventional contact or bond pads 66 formed on the die 22 and the probes 16, and are used to conduct electrical power and electrical signals from the probes 16 to the IC formed on the die. Once electrical power and stimulation signals are applied to the die 22, it becomes functional enough to be tested and analyzed for failures by the use of the system 10.

Preferably the testing is performed and the analysis is conducted by the use of photo emission microscopy, in which defects may be identified and analyzed as a result of the photo emissions generated by such defects and observed through the microscope 12. Electrical power and stimulation signals are supplied through the power supply or tester 18 and conducted to the probes 16 over the connection wires 19. The die 22, interconnectors 11 and the probes 16 are preferably placed or held in place on the platen 14, which is part of a conventional test station (not otherwise shown) which also supports the microscope 12.

Figure 3:
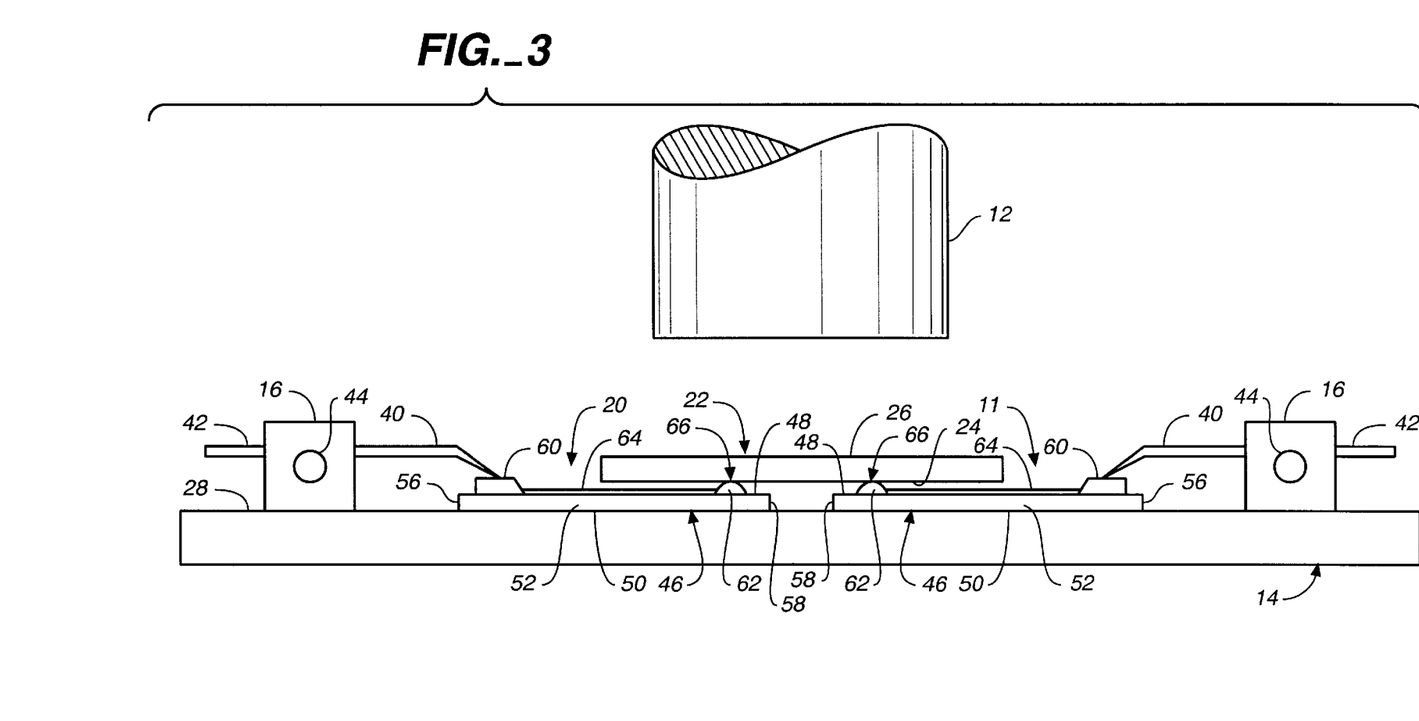
FIG. 3 is a side elevation view of the die, the interconnector, and a portion of the optical system as shown in FIG. 1.

The die 22 has a front side 24 and a back side 26 as shown in FIGS. 1 and 3. The semiconductor structures forming the IC on the die 22 are typically formed on the front side 24 of the die. The back side 26 of the die is a surface of the substrate upon which the IC is formed. Photo emission microscopy may be performed on the back side 26 of the die 22 using the microscope 12 while power is applied to the semiconductor device or IC, because the photo emissions readily pass through the substrate and are observed from the back side 26 of the die 22 through the microscope 12. However, testing and failure analysis by using photo emission detection techniques viewed from the front side 24 of the die 2 may also be performed using the interconnects 11 of the present invention, provided that the semiconductor structures on the front side 24 of the die 22 do not diffuse or distort those photo emissions to the point that accurate evaluation of the die 22 is impossible.

Figure 2:
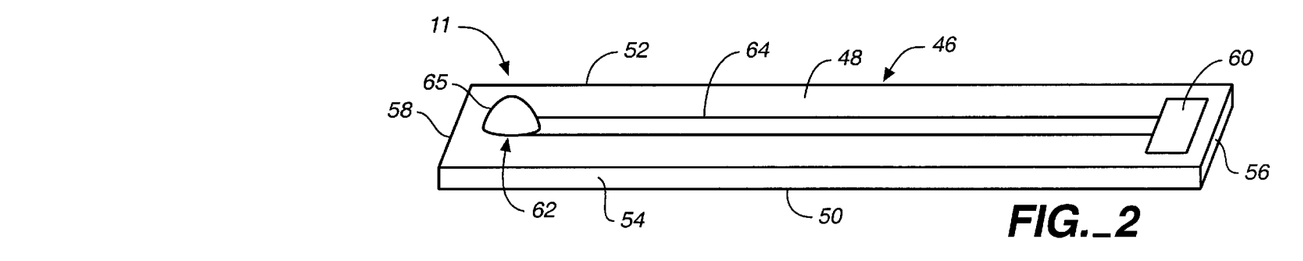
FIG. 2 is a perspective view of an interconnector shown in FIG. 1.

The interconnector 11 is shown in greater detail in FIG. 2. The interconnector 11 is formed from a strip of electrically non-conductive, flexible polymer tape 46 having a top surface 48, a bottom surface 50, two elongated edges 52 and 54, and two ends 56 and 58. An electrically conductive probe pad 60 is mounted on the top surface 48 at one end 58 of the interconnector 11. A slightly elevated and electrically conductive bump contact 62 is mounted on the top surface 48 at the other end 56 of the tape 46. The probe pad 60 and the bump contact 62 are electrically connected with a conductive trace 64. The trace 64 extends along the top surface 48 and is parallel to the two elongated edges 52 and 54. Alternatively, the trace 64 may be positioned within the interior of the tape, so that the trace 64 is not exposed on the top surface 48 of the interconnector 11. The probe pad 60, bump contact 62 and trace 64 are preferably formed from metal or another electrically conductive material. The bump contact 62 includes an adhesive 65 to physically attach itself to bonding pads 66 of the die 22, and thereby attach the interconnector 11 to the die 22 as shown in FIG. 3. Preferably, the bump contact 62 has sufficient height to physically separate the trace 64 and the top surface 48 of the tape 46 from die 22, thereby avoiding contact between the trace 64 and the bond pads 66 while the bump contact 62 is connected to the die 22 as shown in FIG. 3. Preferably, the interconnector 11 is a portion of a conventional tape bond in the form of a single strip for making a single electrical connection between the die 22 and the probe 16.

The interconnector 11 shown in FIG. 2 is typically intended for use in back side photo-emission optical analysis. In back side photo-emission optical analysis, the back side 26 of the die 22 is positioned to face upward, as shown in FIG. 1. Because the back side 26 of the die 22 faces upward, the bond pads 66 of the die face downward, since the bond pads 66 are formed on the front side 24 of the die. In order to contact the downward facing bond pads 66, the bump contact 62 of the interconnector 11 face upward. The probe pad 60 of the interconnector 11 also faces upward so that it may be readily contacted by one of the probes 16, as shown in FIG. 1. In those cases where the photo-emission analysis is performed on the front side 24 of the die, the bump contact 62 and the probe pad 60 of the interconnector 11 are on opposite sides of the tape 46. By being positioned on opposite sides, the bump contact 62 faces downward to contact the upward facing bond pads of the front side 24 of the die 22, while the probe pad 60 faces upward to be contacted by the probes 16 in the same manner as a shown in FIG. 1.

Figure 4:
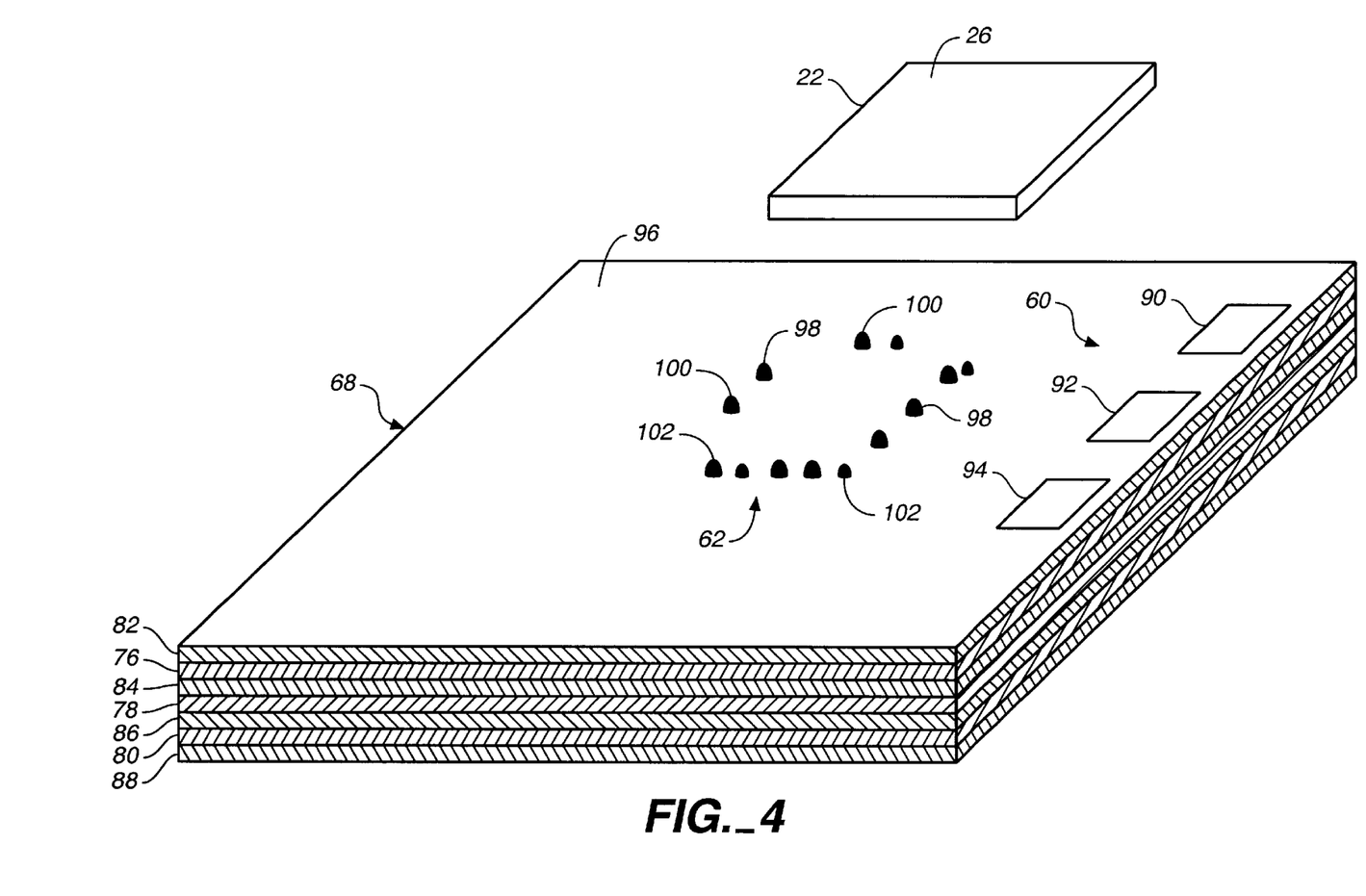
FIG. 4 is an perspective view of an interconnector which incorporates the present invention and which is an alternative to the interconnector shown in FIG. 1, shown in exploded relationship relative to a die.
Figure 5:
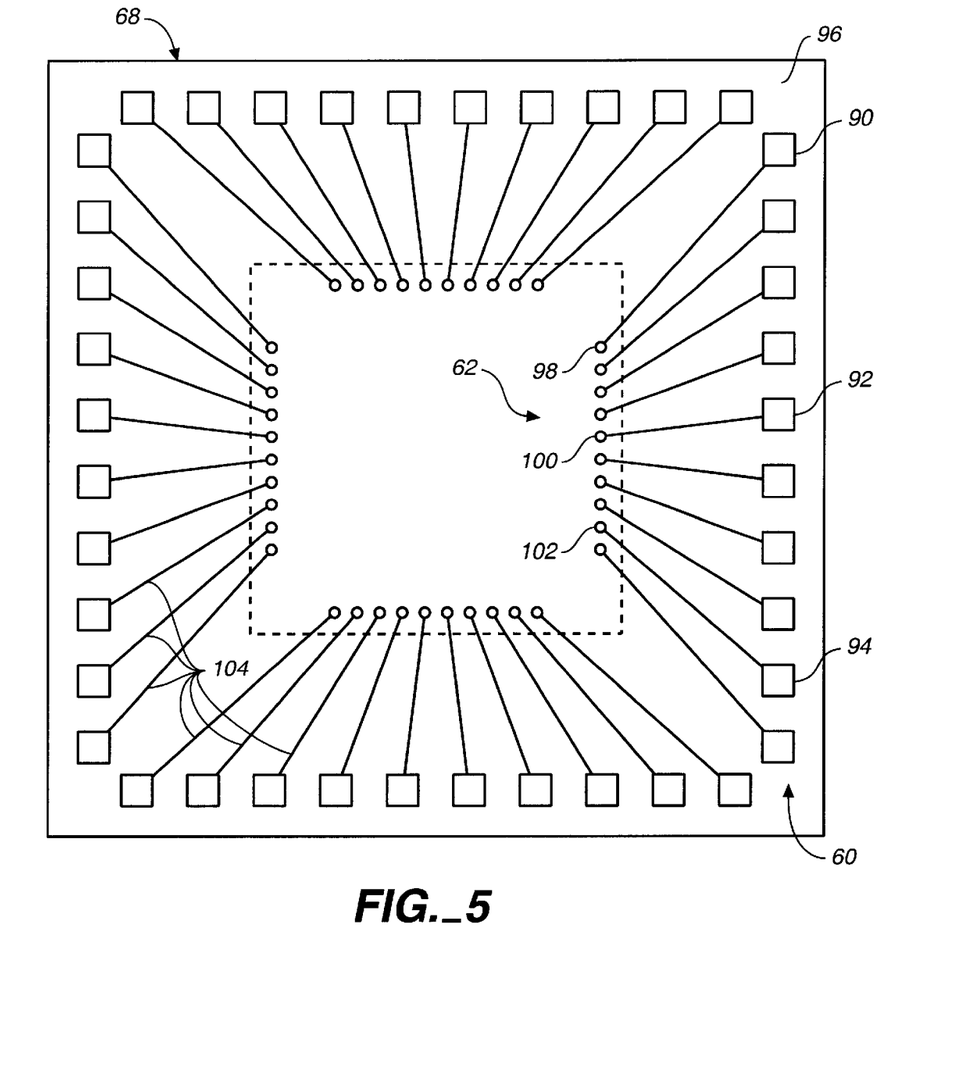
FIG. 5 is a top plan view of the interconnector shown in FIG. 4.
Figure 6:
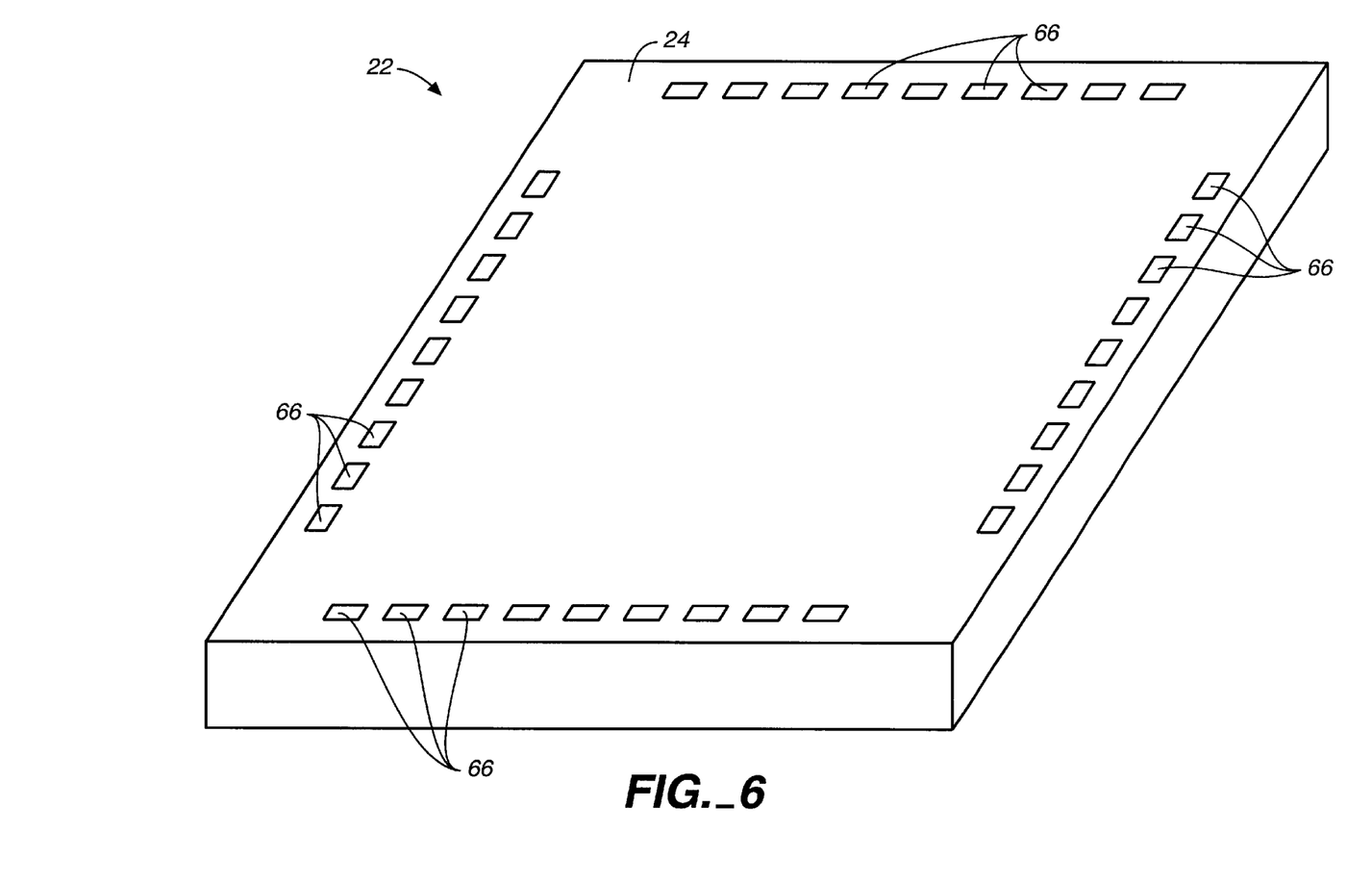
FIG. 6 is a perspective view of the die shown in FIGS. 1 and 3.

As an alternative to the interconnector 11 which connects to a single bond pad 66, and other embodiment takes the form of an interconnector pad 68 which is shown in FIGS. 4, 5 and 6. The interconnector pad 68 simultaneously contacts a plurality of bond pads 66 of the die 22. The bond pads are typically formed around the periphery of the die 22 as shown in FIG. 6. However, the bond pads 66 may be formed in the interior of the IC or at other locations on the front side 24 of the die 22. Bump contacts 62 on the interconnector pad 68 are formed at predetermined positions to line up with and contact the bond pads 66 (FIG. 3) on the front side 24 of the die 22 as shown in FIG. 4, when the interconnector pad 68 is placed over the die 22. The adhesive 65 of the bump contacts 62 holds the interconnects pad 68 in place in contact with the die 22.

The interconnector pad 68 is preferably formed as a laminated structure with electrically conductive layers 76, 78 and 80 alternating with electrically insulating layers 82, 84, 86 and 88 as shown in FIG. 4. The insulating layers 82, 84, 86 and 88 are preferably layers of non-conductive, flexible polymer tape. At least one power probe pad 90, a ground probe pad 92, and at least one signal probe pad 94 are mounted on a top surface 96 of the uppermost insulating layer 82. The power probe pad 90 is electrically connected to the conductive layer 76 which distributes electrical power throughout the interconnector pad 68. The ground probe pad 92 is electrically connected to the conductive layer 78 which distributes at electrical ground reference plane throughout the interconnector pad 68. Each signal probe pad 94 is electrically connected to the conductive layer 80 which distributes stimulation signals throughout the interconnector pad 68. The probe pads 90, 92 and 94 are electrically insulated from each other by their spaced apart positions on the insulating layer 82.

Bump contacts 62 are also mounted on the top surface 96 of the uppermost insulating layer 82. The bump contacts 62 include at least one power contact 98, at least one ground contact 100, and at least one signal contact 102. The contacts 98, 100 and 102 touch the bond pads 66 (FIG. 6) of the die 22 to supply power and stimulation signals to the die 22, when the interconnector pad 68 is brought into contact with the front side 24 of the die 22. The power contact 98 is electrically connected to the power conductive layer 76 by the internal conductor (not shown) which extends through the insulating layer 82. The ground contact 100 is electrically connected to the ground conductive layer 78 by an internal conductor (not shown) which extends through the insulating layer 82, the power conductive layer 76 and the insulating layer 84. The signal contact 102 is electrically connected to a signal conductive layer 80 by an internal conductor (not shown) which extends through the insulating layer 82, the power conductive layer 76, the insulating layer 84, the ground conductive layer 78 and the insulating layer 86. In this manner each bump contact 62 is connected to one of the conductive layers 76, 78, or 90. In addition, multiple bump contacts 62 may be connected to the same conductive layer 76, 78 or 80.

Although the interconnector pad 68 is shown with three conductive layers, it may contain any number of conductive layers laminated between insulating layers. The conductive layers may include any combination of power, ground and signal layers laminated in any order.

An alternative arrangement of the interconnector pad 68 is shown in FIG. 5. In the embodiment shown in FIG. 5, the power probe pad 90, the ground probe pad 92 and the signal probe pad 94 are connected to the power bump contact 98, the ground bump contact 100 and the signal bump contact 102 by individual traces 104, in a manner similar to the way that the contact bump 62 is connected to the probe pad 60 by the trace 64 in the interconnector 11 shown in FIG. 2. However, the alternative embodiment of the interconnector pad 68 shown in FIG. 5 presents multiple probe pads, traces and contact bumps on a singular structure.

To perform backside photo emission microscopy of the die 22, the die 22 is placed on an upper surface 28 of the platen 14 with the front side 24 of the die 22 facing upward and the back side 26 of the die facing downward as shown in FIG. 3. The interconnectors 11 are connected to the bond pads 66 on the front side 24 of the die 22 by contacting the bump contacts 62 to the bond pads 66 while attaching the top surface 48 of each interconnector 11 to the die 22. The bump contact 62 forms electrical connections with the bond pads 66 while the adhesive on the top surface 48 forms a physical connection with the die 22 to hold each bump contact 62 in contact with a bond pad 66.

After the interconnectors 11 are attached to the die 22, the die 22 and the interconnectors 11 are then turned over and placed on the platen 14. Preferably, the adhesive holds the interconnectors 11 in place while turning the die 22 over, connecting probes 16 to the probe pads 60 of the interconnectors 11 and performing failure analysis on the back side 26 of the die 22.

Each conventional probe 16 is then manipulated into contact with the probe pad 60. The probes 16 are also attached to the upper surface 28 of the platen 14. Each probe 16 includes a probe tip 40, a probe connector 42, and a probe manipulator 44 as shown in FIGS. 1 and 3. The probe manipulator 44 is used for manipulating the position of the probe tip 40 to place the probe tip 40 on the probe pads 60 of the interconnector 11. The probe manipulator 44 includes controls for adjusting x, y and z axis movement of the probe tip 40 during probe placement. Preferably, the probes 16 are first coarsely positioned on the surface 28 of the platen 14, and then the probe tips 40 are finely positioned and placed in contact with one of the probe pads 60 of the interconnectors 11 using the probe manipulators 44. The probe connectors 42 make an electrical connection with the probe tips 40 through the probe pads 60. However, the probe connectors 42 and the probe tips 40 are electrically insulated from other portions of the probe 16 and the surface 28 of the platen 14. The probe tips 40 are placed on the probe pads 60 of the interconnectors 11 to form an electrical connection between the probe pads 60 and probe tips 40. The probes 16 are connected to the power supply or tester 18 with the connection wires 19 to make an electrical connection between the power supply or tester 18 and a selected IC formed on the die 22. Preferably, the electrical connection is made after the die 22 is turned over and placed on the platen 14.

The power supply or tester 18 is turned on to energize the IC on the die 22 and to induce photo emissions from faults in the IC formed on the die 22. Testing or failure analysis is then performed of the back side 26 of the die 22 using optical failure analysis techniques to detect and isolate the photo emissions. Preferably, the photo emissions are detected and isolated using the photo emission microscope 12, although other conventional optical failure analysis devices, such as a CCD camera and a video monitor, may be used to detect the photo emissions and isolate the faults in the IC.

The interconnector pad 68 (FIGS. 4 and 5) is used as an alternative to the interconnector 11 (FIG. 2) but in much the same way as the interconnector 11, except that the interconnector pad 68 causes the bump contacts 98, 100 and 102 to contact the bonding pads 66 of the die simultaneously and has an integral structure. The integral structure of the interconnector pad 68 facilitates contact with the bond pads of the die, since all of the relevant bond pads 66 are contacted at one time rather than requiring a singular interconnector 11 to be extended to and connected with each bond pad 66 of the die 22.

In addition, front side testing and failure analysis may be conducted in the same manner as has been described above in conjunction with the back side testing and analysis, for those embodiments of the interconnectors 11 and interconnector pad 68 which have the probe pads on the opposite sides of those structures from the contact bumps.

The interconnectors 11 and interconnect pad 68 facilitate the electrical connection of the probes 16 to the die 22 for optical testing and failure analysis techniques. The interconnectors 11 and the interconnect pad 68 are placed on the bond pads 66 of the die 22 while the die 22 is in a convenient and normal viewing orientation to facilitate the relatively easy placement of those bump contacts on the bond pads. After the interconnectors 11 and interconnect pad 68 are placed on bond pads 66, the die 22 is easily turned over and placed on the platen 14 for optical testing and failure analysis as shown in FIG. 1. Using the interconnectors 11 and interconnect pads 68 prevent errors and reduces the time required to connect the probes 16 to the die 22, because the probe pads 60 are readily observable and easily contacted by the probes 16. Reverse images the are avoided when connecting the probes 16 to the die 22, and indirect mechanical placement of the probes 16 is avoided. The back side 26 of the die 22 is exposed for viewing by the photo emission microscope 12 as used in performing optical failure analysis. Many other advantages and improvements will be apparent after gaining an understanding of the present invention.

The presently preferred embodiment of the present invention has been shown and described with a degree of particularity. This descriptions is of a preferred example of the invention. In distinction to its preferred example, it should be understood that the scope of the present invention is defined by the scope of the following claims, which should not necessarily be limited to the detailed description of the preferred embodiment set forth above.

The invention claimed is:

1. A method of performing at least one of testing or failure analysis on a die having a front side and a back side and an integrated circuit and at least one bond pad connected to the front side of the die, by using an interconnector; the interconnector comprising a piece of electrically insulating material, an electrically conductive bump contact extending from one side of the insulating material, a probe pad connected to the insulating material and extending from the one side of the insulating material at a spaced apart location from the bump contact, and an electrical connector extending between the bump contact and the probe pad; said method comprising:

positioning the front side of the die for optical observation with a microscope;

observing the front side of the die through the microscope;

electrically contacting the bump contact to the bond pad while observing the front side of the die through the microscope;

adhesively connecting the interconnector to the die to maintain the electrical contact between the bump contact;

positioning the interconnector relative to the die to locate the probe pad beyond an exterior peripheral edge of the die while observing the front side of the die through the microscope;

inverting the die and the adhesively connected interconnector;

observing the back side of the die and the probe pad through the microscope after inverting the die and the adhesively connected interconnector;

connecting a probe to the probe pad while the die and the adhesively connected interconnector are inverted and while observing the probe pad through the microscope;

supplying at least one of an electrical signal or electrical power through the probe to induce functional responsiveness in the integrated circuit; and performing the testing or failure analysis while integrated circuit functionally responds to the one of the signal or power.

2. A method as defined in claim 1, further comprising:

maintaining the bump contact in contact with the bond pad by adhesively connecting the bump contact to the bond pad.

3. A method as defined in claim 1, further comprising:

maintaining the bump contact in contact with the bond pad by adhesively connecting the interconnector to the die.

4. A method as defined in claim 1, further comprising:

optically examining the back side of the die through the microscope while the die functionally responds to the one of the signal or power and while the die and the adhesively connected interconnector are inverted.

5. A method as defined in claim 1, performed by using a plurality of interconnectors; wherein each interconnector has a form of an elongated strip with the bump contact located at one end of the elongated strip and the probe pad located at the other end of the strip, and wherein the die has a plurality of bond pads; said method further comprising:

attaching each elongated strip to a different selected bond pad of the die by electrically contacting the bump contact to the selected bond pad, by adhesively connecting the elongated strip to the die and by positioning the elongated strip relative to the die to locate each probe pad beyond an exterior peripheral edge of the die; and inverting the die after each of the plurality of elongated strips have been attached to the die.

6. A method as defined in claim 5, wherein the elongated strip is formed in multiple laminated layers with a conductive layer between two insulated layers and the conductive layer is electrically connected to the bump contact and to the probe pad; and said method further comprises:

connecting the probe to the probe pad by contacting the probe to the conductive layer.

7. A method as defined in claim 1, wherein the die has a plurality of bond pads located at predetermined positions, and the interconnector is formed as a rectangularly shaped structure having a plurality of the bump contacts located at a generally interior position of the structure and at positions corresponding to the predetermined positions of the bond pads on the die, the rectangular structure further having a plurality of the probe pads located at a generally exterior positions adjacent to peripheral edges of the structure; said method further comprising:

attaching the rectangular structure to the die by electrically contacting each of the plurality of bump contacts to the correspondingly positioned bond pads, by adhesively connecting the rectangular structure to the die and by positioning the rectangular structure relative to the die to locate the probe pads beyond an exterior peripheral edge of the die; and inverting the die after the rectangular structure has been attached to the die.

8. A method as defined in claim 7, wherein the rectangular structure is formed in multiple laminated layers with a plurality of conductive layers separated by insulated layers and each one conductive layer is electrically connected to at least one bump contact and to at least one probe pad; and said method further comprises:

connecting the probe to the probe pad by contacting the probe to the conductive layer.

\* \* \* \* \*